(12) United States Patent
Iwase et al.

(10) Patent No.: US 6,768,534 B2
(45) Date of Patent: Jul. 27, 2004

(54) DISPLAY UNIT AND METHOD OF MANUFACTURING THE DISPLAY UNIT

(75) Inventors: Yuichi Iwase, Kanagawa (JP); Hitoshi Tamashiro, Kanagawa (JP); Yasunori Kijima, Tokyo (JP)

(73) Assignee: Sony Corporation (JP)

( * ) Notice: Subject to any disclaimer, the term of this patent is extended or adjusted under 35 U.S.C. 154(b) by 137 days.

(21) Appl. No.: 10/053,701

(22) Filed: Jan. 24, 2002

(65) Prior Publication Data

US 2002/0131008 A1 Sep. 19, 2002

(30) Foreign Application Priority Data

Jan. 26, 2001 (JP) ..................................... P2001-017801

(51) Int. Cl.[7] ........................................... G02F 1/1339
(52) U.S. Cl. ..................... 349/153; 313/505; 313/512
(58) Field of Search ................................. 313/512, 502, 313/503, 504, 505, 506; 349/153

(56) References Cited

U.S. PATENT DOCUMENTS 5,909,081 A * 6/1999 Eida et al. .................. 313/504
6,039,896 A * 3/2000 Miyamoto et al. .......... 252/511
6,624,570 B1 * 9/2003 Sano et al. .................. 313/506

* cited by examiner

Primary Examiner—Robert H. Kim
Assistant Examiner—David Chung
(74) Attorney, Agent, or Firm—Rader, Fishman & Grauer PLLC; Ronald P. Kananen

(57) ABSTRACT

Light-emitting devices are formed on a support substrate, whereas a black matrix is provided on a transparent opposed substrate. The support substrate and the opposed substrate are adhered to each other in the condition where the display devices are sealed with an adhesive resin and the adhesive resin is charged between the support substrate and the opposed substrate. In this case, alignment of the support substrate and the opposed substrate is conducted so that the surface of the opposed substrate provided with the black matrix is faced to the surface of the support substrate provided with the light-emitting devices and the black matrix is disposed faced to the spaces between the light-emitting devices. The alignment is conducted by disposing alignment marks provided on the surface of the support substrate provided with the light-emitting devices and alignment marks provided on the opposed substrate into a predetermined condition.

14 Claims, 3 Drawing Sheets

F I G. 1A
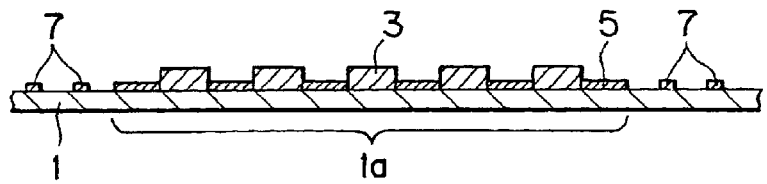
F I G. 1B
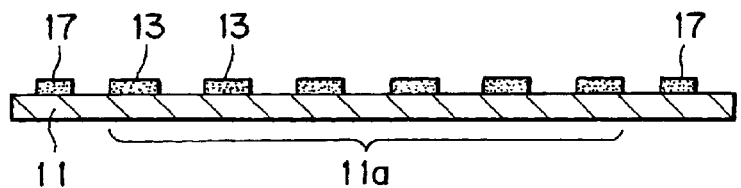
F I G. 1C
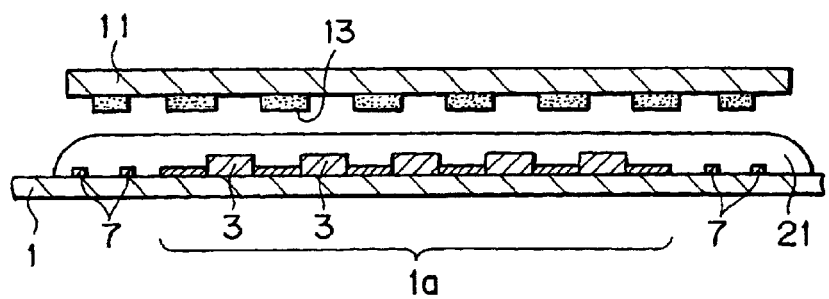
F I G. 1D
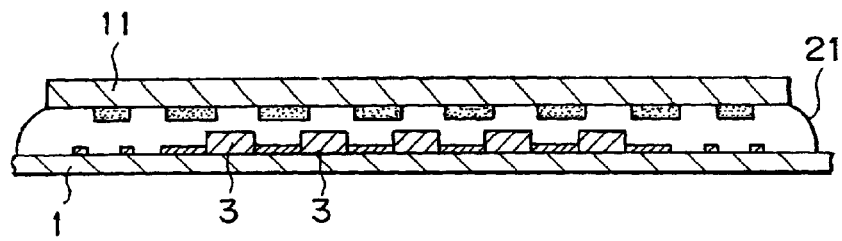
F I G. 1E
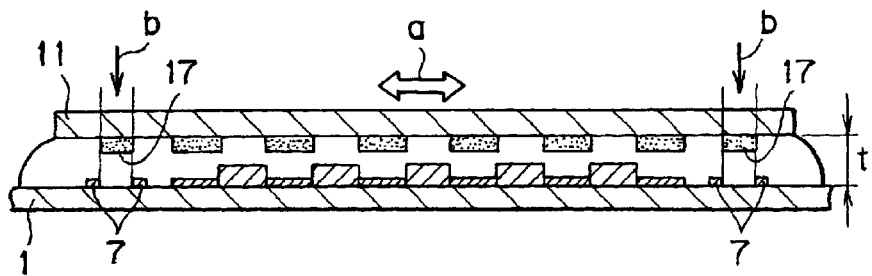

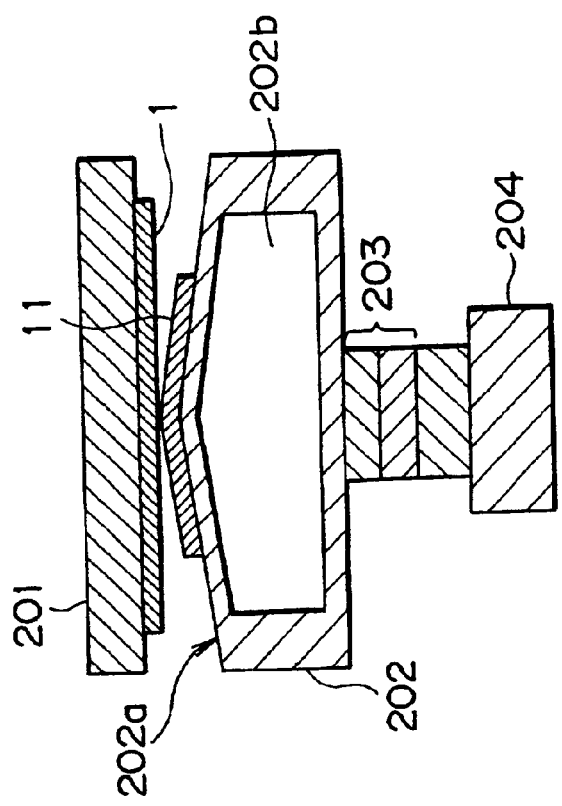
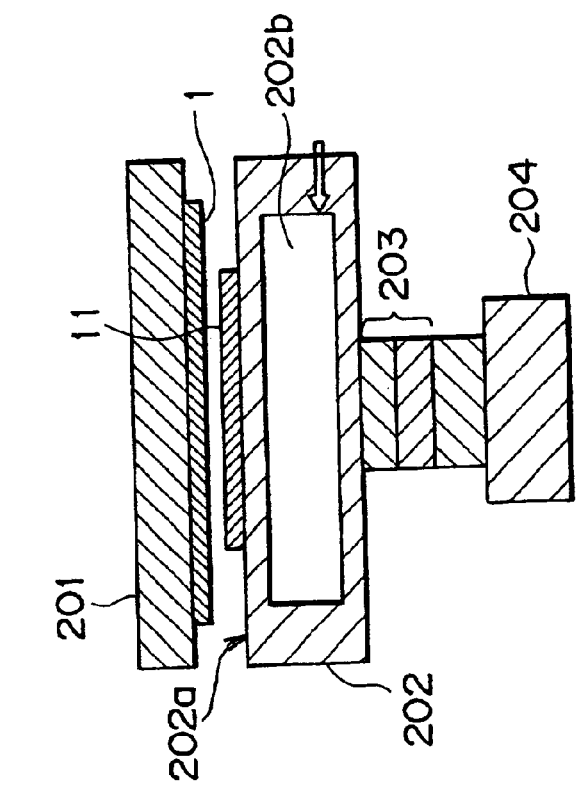

F I G. 3A
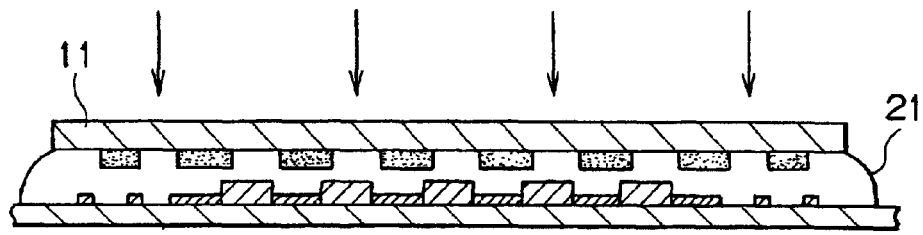
F I G. 3B
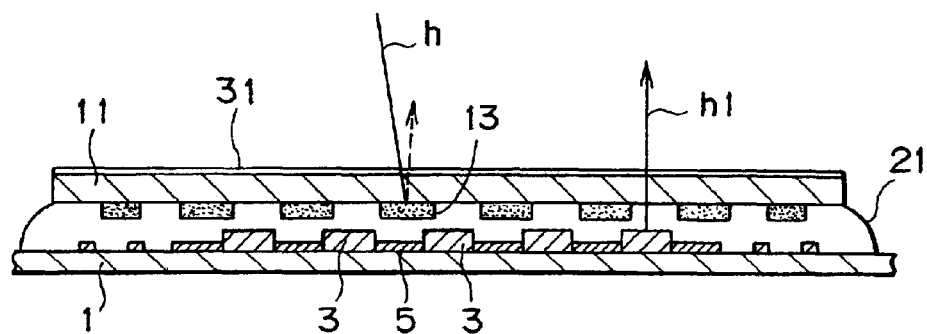
F I G. 4
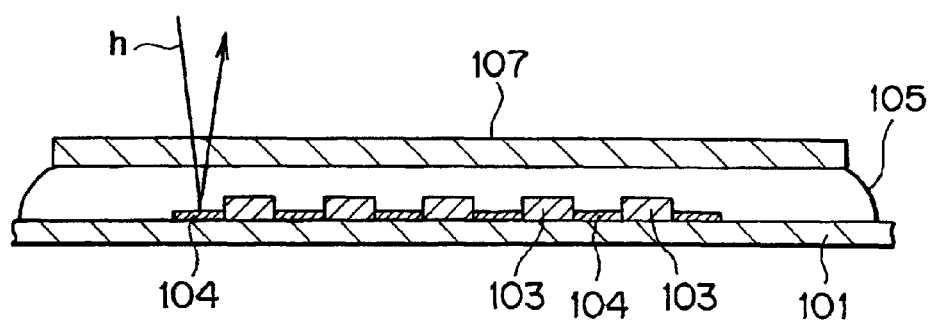

DISPLAY UNIT AND METHOD OF MANUFACTURING THE DISPLAY UNIT

BACKGROUND OF THE INVENTION

The present invention relates to a display unit and a method of manufacturing the display unit; and, particularly relates to a display unit preferable for an upper surface light-emitting type in which display light is picked up from the side of an opposed substrate opposite to a support substrate provided with a display region and a method of manufacturing the same.

The organic electroluminescence (hereinafter referred to as EL) device, which is a self-light-emitting type device (hereinafter referred to as light-emitting device), has a structure in which an organic film that includes an organic light-emitting layer is sandwiched between a lower electrode and an upper electrode, which constitute a cathode or an anode, and is paid attention to as a light-emitting device capable of high-luminance light emission by driving with a low-voltage direct current.

In an active matrix type display unit using such light-emitting devices (namely, an organic EL display) a thin-film transistor is provided at each pixel, and the light-emitting devices are formed at pixel portions on an inter-layer insulation film provided to cover the thin-film transistors. Here, in order to secure an opening factor of the light-emitting devices in the active matrix type display unit, it is effective to adopt the so-called upper surface light pick-up structure (hereinafter referred to as upper surface light-emitting type) in which the light emitted from the light-emitting devices is picked up from the side of the upper electrodes opposite to the substrate.

In such an upper surface light-emitting-type display unit, the upper electrodes are formed of a transparent material, and since such a material has a high resistance, a voltage gradient is generated in the upper electrodes and a voltage drop is liable to occur. Therefore, auxiliary electrodes are provided in the state of being connected to the upper electrodes at spaces between the pixels where the light-emitting devices are formed, whereby lowering of the light-emitting intensity is suppressed.

Besides, it is known that the function of the light-emitting devices may be spoiled due to damage to the organic film by moisture or oxygen. Therefore, in the upper surface light-emitting-type display unit comprising such light-emitting devices, as, for example, shown in FIG. 4, a sealing resin 105 is applied to cover the light-emitting devices 103 provided on a support substrate 101, and a transparent substrate 107 is adhered onto the support substrate 101 through the sealing resin 105, whereby the light-emitting devices 103 are sealed.

However, in the display unit having the above-mentioned constitution, as shown in FIG. 4, inter-device wiring 104 constituted, for example, of the auxiliary electrodes provided in connection with the upper electrodes (not shown) of the light-emitting devices 101 and the wiring for the lower electrodes constituting the light-emitting devices 101 and the like can be seen from the display surface side through the upper electrodes constituting the light-emitting devices 101 and the transparent substrate 107. Here, ordinarily, the auxiliary electrodes are formed of a low-resistance material, such as aluminum, and the lower electrodes of the upper surface light-emitting type display devices 103 are in some cases formed of a metallic material having a high reflectance. Therefore, reflectance for external light at the surfaces of the inter-device wiring 104 constituted of these electrodes is high, and the light h incident from the side of the transparent substrate 107 is reflected by the inter-device wiring 104, causing a lowering in the contrast of the display unit.

SUMMARY OF THE INVENTION

Accordingly, it is an object of the present invention to provide an upper surface light-emitting-type display unit having good contrast and a method of manufacturing a display unit suitable for producing the display unit.

In order to attain the above object, according to one aspect of the present invention, there is provided a display unit comprising a support substrate provided with light-emitting devices, a transparent opposed substrate provided with a black matrix and disposed on the side of the surface forming the light-emitting device of the support substrate, and a sealing adhesive resin charged between the support substrate and the opposed substrate in the condition of sealing the light-emitting devices.

In such a display unit, the spaces between the light-emitting devices provided on the support substrate are covered with the black matrix provided on the transparent opposed substrate. Therefore, external light incident from the side of the transparent opposed substrate for sealing the light-emitting devices is prevented from reaching the spaces between the light-emitting devices, reflection of the external light at the surfaces of inter-device wirings can be prevented, and only the light emitted from the light-emitting devices is picked up from the side of the opposed substrate by being transmitted through the adhesive resin and the opposed substrate. Therefore, it is possible to enhance the contrast of the upper surface light-emitting-type display unit in which the light emitted from the light-emitting devices is picked up from the side opposite to the support substrate.

According to another aspect of the present invention, there is provided a method of manufacturing a display unit which comprises the steps of providing light-emitting devices on a support substrate, providing a black matrix on a transparent opposed substrate, and adhering the support substrate and the opposed substrate in the condition where the display devices are sealed with an adhesive resin and the adhesive resin is charged between the support substrate and the opposed substrate.

According to such a method, the black matrix is provided on the side of the transparent opposed substrate provided for sealing the light-emitting devices together with the adhesive resin. Therefore, in the display unit having a constitution in which the light generated in the light-emitting devices is picked up from the side of the transparent opposed substrate, a display unit comprising the black matrix on the upper side of the support substrate provided with the light-emitting devices, as viewed from the display surface side, is obtained. Namely, a display unit in which the black matrix is provided on the side of the opposed substrate capable of picking up the light generated in the light-emitting devices is obtained.

According to a further aspect of the present invention, there is provided a method of manufacturing a display unit comprising the steps of disposing an opposed substrate on the side of a display region provided on a support substrate, adhering the support substrate and the opposed substrate through an adhesive resin, wherein alignment of the support substrate and the opposed substrate is conducted in the condition where the support substrate and the opposed substrate are adhered through the adhesive resin and before the adhesive resin is cured, and thereafter curing the adhesive resin.

In such a method, the curing of the adhesive resin is conducted in the condition where the support substrate and the opposed substrate are maintained in the positional relationship determined by the alignment. In the case of adhering the support substrate and the opposed substrate after alignment, variations in the relative positions of the support substrate and the opposed substrate generated in an adhering operation cannot be corrected. On the contrary, according to the method of the present invention, alignment is conducted after adhesion, so that variations in the relative positions of the support substrate and the opposed substrate generated in an adhering operation can be corrected by the alignment after the adhering operation, and the positional relationship between the support substrate and the opposed substrate is maintained with high accuracy at the time of curing the adhesive resin. Therefore, it is possible to highly accurately position the display devices on the support substrate and the black matrix on the opposed substrate and to obtain a display unit with high contrast in which reflection of external light at inter-device wirings is securely prevented by the black matrix.

The above and other objects, features and advantages of the present invention will become apparent from the following description and appended claims taken in conjunction with the accompanying drawings which show by way of example some preferred embodiments of the invention.

BRIEF DESCRIPTION OF THE DRAWINGS

FIGS. 1A through 1E are a set of sectional process step views (No. 1) illustrating a method of manufacturing a display unit according to one embodiment of the present invention;

FIGS. 2A and 2B are constitutional views showing one example of an adhering equipment;

FIGS. 3A and 3B are a set of sectional process step views (No. 2) illustrating the method of manufacturing a display unit according to the embodiment of the present invention; and FIG. 4 is a view illustrating a conventional display unit and the problems thereof.

DESCRIPTION OF THE PREFERRED EMBODIMENTS

Now, embodiments of the display unit and the method of manufacturing the same according to the present invention will be described below referring to the drawings. Here, the embodiments will be described by showing as an example a display unit in which organic EL devices as light-emitting devices are arranged in a display region. But the present invention is not limited to display units using the organic EL devices as the light-emitting devices, and it can be widely applied to display units using self-light-emitting devices such as, for example, inorganic EL devices.

FIG. 1 is a set of sectional process step views for illustrating the production of a display unit according to the present embodiment, and the constitution of the display unit according to the present embodiment will be described in the order of production steps.

First, as shown in FIG. 1A, a support substrate 1 comprising thin film-transistors (hereinafter referred to as TFT) (not shown) provided on a glass is prepared, and light-emitting devices 3, inter-device wirings 5 and alignment marks 7 are provided on the TFT formation surface of the support substrate 1 through a flattening insulation film (not shown). Where the display unit produced here is of the upper surface light-emitting type, the support substrate 1 need not be formed of a transparent material, and other than glass, substrates (for example, a silicon substrate or the like) can be used.

Here, the TFTs are provided for each of a plurality of pixels provided in a display region 1a of the support substrate 1, and the light-emitting devices 3 are formed at each pixel in the state of being connected to the TFTs. The light-emitting device 3 comprises, for example, an anode lower electrode, an organic layer and a cathode upper electrode sequentially laminated. The inter-device wirings 5 are provided for each of the spaces between the devices in the condition of being connected to the light-emitting devices 3. Further, the alignment marks 7 are provided, for example, on the outside of the display region 1a on the support substrate 1, for example, at four corners of the support substrate 1.

Next, the procedure of providing the light-emitting devices 3, the inter-device wirings 5 and the alignment marks 7 on the support substrate 1 will be described.

First, the anode lower electrodes constituting the light-emitting devices are formed. In this case, an anode film formed of a material having a high work function, such as a Cr (chromium) film, is formed by a sputtering method, and is patterned to form the anode lower electrodes. The anode lower electrodes are formed by patterning in correspondence with each of the pixels and are connected respectively to the TFTs similarly provided for each of the pixels through contact holes (not shown) formed in an inter-layer insulation film provided to cover the TFTs.

Next, an insulation layer in the shape of covering the peripheries of the anode lower electrodes formed for each of the pixels is formed, and an organic EL layer is formed on the anode lower electrodes exposed from the insulation layer. In this case, an organic positive hole-transport layer, an organic light-emitting layer, an electron-transport layer and the like, namely, organic layers including at least the organic light-emitting layer, are formed by vapor deposition using masks in a predetermined order.

Inter-device wirings 5 formed of a low-resistance material such as, for example, aluminum are pattern-formed on the insulation layer covering the peripheries of the anode lower electrodes, namely, between the pixels where the light-emitting devices 3 are provided. The inter-device wirings 5 are used, for example, as auxiliary electrodes for cathode upper electrodes to be provided in a subsequent step and may function also as a spacer for mounting thereon a vapor deposition mask for forming the organic EL layer. Where the inter-device wirings 5 also function as the spacer for mounting thereon the vapor deposition mask, the inter-device wirings 5 are formed after the formation of the insulation layer covering the peripheries of the anode lower electrodes and before the formation of the organic EL layer.

In the same step as the step of forming the inter-device wirings 5, alignment marks 7 are formed at four corners on the support substrate 1. The alignment marks 7 are formed of the same material (for example, aluminum) as the inter-device wirings 5.

After the organic EL layer, the inter-device wirings 5 and the alignment marks 7 are provided as above-mentioned and the vapor-deposition mask used for vapor deposition of the organic EL layer is removed from the position on the support substrate 1, a cathode film is vapor deposited on the entire surface of the support substrate 1 by vacuum vapor deposition (for example, resistance heating vapor deposition). By this, the upper side of the organic EL layer is covered, and the cathode upper electrode (not shown) in a solid film shape connected to the inter-device wirings 5 is formed. Here, a material having a low work function is used as a material for the cathode film; among others, where the display unit is of the upper surface light-emitting system, a light-transmitting material, such as, for example, Mg—Ag (an alloy of magnesium and silver), is used as the material. In addition, a transparent conductive film, such as an indium tin oxide film (ITO), may be provided on the Mg—Ag film to be the cathode.

Thereafter, though not shown in the figure, the cathode upper electrode is formed, and then a sealing film is provided on the support substrate 1 in the state of covering the cathode upper electrode. The sealing film is formed of a transparent material having a dense film property and a high effect of sealing oxygen and moisture, for example, a silicon nitride film, and is constituted of either a single layer or a plurality of layers in combination with silicon oxide or the like.

In this manner, the light-emitting devices 3 each comprising the organic EL layer sandwiched between the anode lower electrode and the cathode upper electrode, the inter-device wirings 5 connected to the cathode upper electrode of each light-emitting device 3, and the alignment marks 7 formed in the same step as the inter-device wirings 5 are provided on the support substrate 1 provided with the TFTS.

The constitution of the light-emitting device 3 is not limited to the constitution comprising the anode lower electrode, the organic EL layer and the cathode upper electrode sequentially laminated as above, and it may be a constitution in which a cathode lower electrode, an organic EL layer and an anode upper electrode are laminated. In that case, the positive Hole_transport layer, the electron transport layer, the light-emitting layer and the like constituting the organic EL layer are laminated in an appropriately selected order, and the cathode lower electrodes are connected to the TFTs in the state of being patterned for each pixel, while the transparent anode upper electrode is formed in a solid film shape.

On the other hand, separately from the steps of forming the light-emitting devices 3 and the like on the support substrate 1, a black matrix 13 and alignment marks 17 are formed on the transparent opposed substrate 11 formed of quartz glass or the like, as shown in FIG. 1B.

Here, the black matrix 13 is formed in a display region 11a of the opposed substrate 11 corresponding to the display region 1a of the support substrate 1. In addition, the black matrix 13 is formed, for example, in a pattern reverse to the pixel arrangement so that it is disposed between the light-emitting devices 3 on the support substrate 1 when the support substrate 1 and the opposed substrate 11 are disposed one on the other in a predetermined condition. The black matrix 13 is not necessarily pattern-formed so as to cover entirely the spaces between the light-emitting devices 3, and it is pattern-formed so as to cover at least the inter-device wirings 5.

The black matrix 13 has an optical density (OD) of not less than 1, preferably not less than 3. The black matrix is composed of, for example, a resin material containing a black pigment dispersed therein, a laminate film having a predetermined reflected light attenuating structure, or a film of a metal having a low reflectance, such as tungsten (W), molybdenum (Mo), nickel (Ni) or chromium (Cr), which is formed in a respective film thickness to obtain a desired optical density.

Where the black matrix 13 composed of a resin material is formed, it is possible to use a resist material with a black pigment dispersed therein, for example, CK-7800 (product name), a product by Fuji Film Olin Co., Ltd. In this case, first, the resist material is applied to the opposed substrate 11 in a film thickness suitable for obtaining a desired optical density, and then pattern exposure and a developing treatment are carried out to remove unexposed portions, thereby forming the black matrix 13.

Where a black matrix 13 composed of a laminate film having a predetermined reflected light attenuating structure is provided, a laminate film comprising a metallic film, a metal nitride film, a metal oxide film or the like laminated in predetermined thicknesses and in an appropriately selected order is used so as to obtain the reflected light attenuating structure necessary for constituting the black matrix 13. A film of a material having a low reflectance, such as chromium (Cr), titanium (Ti) or tungsten (W), can be used as the metallic film constituting the laminate film, and chromium oxide and chromium nitride can be used as the metal oxide film and the metal nitride film. In this case, first, a laminate film with film material, film thickness and lamination order, so selected as to obtain the predetermined reflected light attenuating effect, is formed on the opposed substrate 11. Next, a resist pattern is formed on the laminate film, and then the laminate film is etched by using the resist pattern as a mask, thereby forming the black matrix 13 composed of the laminate film having the above-mentioned reflected light attenuating structure.

On the other hand, the alignment marks 17 are provided in correspondence with the positions where the alignment marks 7 on the support substrate 1 are present. The alignment marks 17 are pattern-formed so that a plurality of sets of predetermined patterns are simultaneously composed when the alignment marks 7 on the support substrate 1 and the alignment marks 17 on the opposed substrate 11 are superimposed on each other. The alignment marks 17 are formed in the same step as the formation of the black matrix 13.

Thereafter, as shown in FIG. 1C, an uncured adhesive resin 21 is applied to the support substrate 1 over the entire surface of the display region 1a provided with the light-emitting devices 3. In this case, for example, the alignment marks 7 are also covered with the adhesive resin 21. The adhesive resin 21 is preferably one whose curing is promoted by application of UV rays or heat, such as, for example, a UV-curable resin or thermosetting resin, and which acquires transparency when cured. The application of the adhesive resin 21 to the support substrate 1 may be conducted by ejecting the adhesive resin from a syringe type or slit-nozzle-type dispenser or by such techniques as roll coating and screen printing.

Next, the opposed substrate 11 is disposed on the support substrate 1 coated with the adhesive resin 21 in the condition where the surface of the support substrate 1 provided with the light-emitting devices 3 and the surface of the opposed substrate 11 provided with the black matrix 13 are faced to each other. In this case, direction determination (θ direction) and rough positioning of the opposed substrate 11 relative to the support substrate 1, namely, rough alignment, is conducted so that the black matrix 13 is disposed between the display device 3 and the display device 3.

Subsequently, as shown in FIG. 1D, the support substrate 1 and the opposed substrate 11 are adhered to each other through the adhesive resin 21 so that bubbles do not enter between the support substrate 1 and the opposed substrate 11. As one example of such adhesion, there may be mentioned a technique in which the opposed substrate 11 is curved to be protuberant toward the support substrate 1 coated with the adhesive resin 21, and the opposed substrate 11 is adhered to the support substrate 1 sequentially from the protuberant portion toward the outer side, whereby bubbles are prevented from mixing into the adhesive resin 21 between the support substrate 1 and the opposed substrate 11.

The adhesion of the support substrate 1 and the opposed substrate 11 may be conducted in the condition where the support substrate 1 is disposed on the opposed substrate 11 coated with the adhesive resin 21.

In addition, the adhesion may be conducted by using, for example, the adhering equipment that is shown in FIG. 2, whereby adhesion while preventing the mixing-in of bubbles can be realized.

The adhering equipment shown in FIG. 2 comprises a first surface plate 201 for attractively fixing the support substrate 1, a second surface plate 202 for attractively fixing the opposed substrate 11, a horizontal driving unit 203 for moving the second surface plate 202 in horizontal directions (x, y, θ directions), and a vertical driving unit 204 for moving the second surface plate 202 in the vertical direction (z).

The attraction of the support substrate 1 onto the first surface plate 201 and the attraction of the opposed substrate 11 onto the second surface plate 202 may be achieved by, for example, vacuum suction, electrostatic attraction or other attraction system.

Particularly, the second surface plate 202 is provided with a hollow portion 202b over the entire region of an attraction surface 202a of the opposed substrate 11, and the inside of the hollow portion 202b can be freely pressurized and decompressed. When the inside of the hollow portion 202b is not pressurized, as shown in FIG. 2A, the attraction surface 202a of the second surface plate 202 is maintained flat, and the opposed substrate 11 is attractively fixed on the flat attraction surface 202a while maintaining flatness. On the other hand, when the inside of the hollow portion 202b is pressurized, as shown in FIG. 2B, the attraction surface 202a of the second surface plate 202 is protuberant to the outer side (in the figure, to the upper side), and the opposed substrate 11 is attractively fixed on the protuberant attraction surface 202a, whereby the opposed substrate 11 is attractingly fixed in the condition of being curved following up to the protuberant shape of the attraction surface 202a.

The adhesion of the support substrate 1 and the opposed substrate 11 by use of such an adhering equipment is conducted as follows. First, as shown in FIG. 2A, the support substrate 1 is attractively fixed on the first surface plate 201, and the opposed substrate 11 is attractively fixed on the attraction surface 202a of the second surface plate 202 maintained flat by maintaining the inside of the hollow portion 202b at normal pressure. Then, an adhesive resin is applied to the entire surface of the opposed substrate 11, and the opposed substrate 11 is moved by the horizontal driving unit 203 of the second surface plate 202, whereby rough alignment of the support substrate 1 and the opposed substrate 11 is conducted. Next, as shown in FIG. 2B, the hollow portion of the second surface plate 202 is pressurized to make the attraction surface 202a protuberant, and the opposed substrate 11 is curved accordingly. In this condition, the vertical driving unit 204 is driven to raise the second surface plate 202, whereby only the protuberant portion of the opposed substrate 11 is first brought into contact with the support substrate 1. Next, raising of the second surface plate 202 by the vertical driving unit 204 and decompression of the inside of the hollow portion 202b are conducted in conjunction with each other, whereby the opposed substrate 11 is adhered to the support substrate 1 sequentially from the protuberant portion toward the outer side. By this, adhesion while preventing the mixing-in of bubbles into the adhesive resin 21 between the support substrate 1 and the opposed substrate 11 is achieved.

In the manner as above, as shown in FIG. 1D, the support substrate 1 and the opposed substrate 11 are adhered to each other through the adhesive resin 21 in the condition where the light-emitting devices 3 are embedded and sealed in the adhesive resin 21 and the adhesive resin 21 is charged between the support substrate 1 and the opposed substrate 11.

Next, as shown in FIG. 1E, accurate alignment of the support substrate 1 and the opposed substrate 11 is conducted in the condition where the support substrate 1 and the opposed substrate 11 are adhered and before the adhesive resin 21 is cured. Here, the support substrate 1 and the opposed substrate 11 are relatively moved on a horizontal plane, as indicated by the void arrows a, and the horizontal positions of the support substrate 1 and the opposed substrate 11 are finely adjusted, so as to bring the four sets of the alignment marks 7 and 17 into predetermined disposition at respective positions, for example, so as to dispose the alignment mark 17 between a pair of the alignment marks 7.

In this case, the fine adjustment is conducted while confirming the positional relationship between the alignment marks 7 provided at four corners of the support substrate 1 and the alignment marks 17 provided at four corners of the opposed substrate 11, for example, by microscopic observation from the side of the transparent opposed substrate 11, as indicated by arrows b, b in the figure. Where the support substrate 1 is formed of a transparent material and, therefore, the alignment marks 7 on the support substrate 1 and the alignment marks 17 on the opposed substrate 11 can be observed from the side of the support substrate 1, the fine adjustment may be conducted while confirming the positional relationship between the alignment marks 7 and the alignment marks 17 by observation from the side of the support substrate 1.

In this case, the horizontally relatively movable range of the support substrate 1 and the opposed substrate 11 is determined by the thickness t of the adhesive resin 21 between the support substrate 1 and the opposed substrate 11. For example, where the thickness t is about 70 $\mu$m, fine adjustment can be conducted by horizontally and relatively moving the support substrate 1 and the opposed substrate 11 in the range of several hundreds of $\mu$m.

The relative movement of the opposed substrate 11 relative to the support substrate 1 may be carried out, for example, by moving the opposed substrate 11 whose outer side is attraction-held by suction disks or the like relative to the fixed support substrate 1, by moving the support substrate 1 whose outer side is attraction-held relative to the fixed opposed substrate 11, or by moving both the support substrate 1 and the opposed substrate 11, and may be conducted on an equipment for exclusive use for alignment after an adhering operation by the adhering equipment.

Alternatively, this alignment may be conducted on the adhering equipment by horizontally moving the surface plate for fixing the support substrate 1 and/or the surface plate for fixing the opposed substrate 11 provided in the adhering equipment. In that case, in the condition where the substrates are fixed on the surface plates, it should be possible to observe the alignment marks 7, 17 from the side of the transparent opposed substrate 11.

After the accurate alignment of the support substrate 1 and the opposed substrate 11 is conducted, as described above, the adhesive resin 21 is cured by irradiation with UV rays, a heating treatment or the like from the transparent opposed substrate 11, as shown in FIG. 3A, whereby the disposed condition of the support substrate 1 and the opposed substrate 11 are fixed.

Next, as shown in FIG. 3B, an anti-reflection film 31 formed of magnesium fluoride (MgF), titanium oxide (TiO) or the like is formed on the surface of the opposed substrate 11, thereby completing the display unit. The formation of the anti-reflection film 31 may be conducted before adhesion of the opposed substrate 11 to the support substrate 1.

In the production method and the display unit obtained thereby, as described above, the spaces between the light-emitting devices 3 provided on the support substrate 1 are covered by the black matrix 13 formed on the transparent opposed substrate 11. Therefore, the external light h incident from the side of the transparent opposed substrate 11 is prevented from passing through the adhesive resin 21 to reach the spaces between the light-emitting devices 3, whereby reflection of the external light at the surfaces of the inter-device wirings 5 can be prevented.

Accordingly, in the upper surface light-emitting-type display unit in which the light h1 generated at the light-emitting devices 3 is picked up from the side opposite to the support substrate 1, reflection of the external light by the inter-device wirings 5 is restrained, only the light h1 generated at the light-emitting devices 3 can be effectively picked up from the side of the opposed substrate 11, and an enhanced contrast can be contrived.

In addition, where the black matrix 13 is disposed faced to the side of the support substrate 1, the outside surface of the opposed substrate 11 is flat in the condition where the opposed substrate 11 is adhered to the support substrate 1, so that the opposed substrate 11 can be easily supported by attraction from the outside in the case of performing alignment. Besides, the anti-reflection film 31 can be formed more uniformly on the flat outside surface of the opposed substrate 11.

Further, in the above-described production method, alignment is conducted in the condition where the support substrate 1 and the opposed substrate 11 are adhered to each other through the adhesive resin 21, so that the adhesive resin 21 can be cured while maintaining the disposed conditions positioned by the alignment. Namely, where the adhesion of the support substrate 1 and the opposed substrate 11 is conducted after alignment, variations in relative positions of the support substrate 1 and the opposed substrate 11 generated by an adhering operation cannot be corrected. On the contrary, in the above-described production method, alignment is conducted after adhesion, so that variations in the relative positions of the support substrate 1 and the opposed substrate 11 generated by an adhering operation can be corrected by the alignment after the adhering operation.

Therefore, the positional relationship of the support substrate 1 and the opposed substrate 11 is highly accurately maintained at the time of curing the adhesive resin 21, and it is possible to obtain a display unit in which the black matrix 13 is disposed in the condition of being positioned highly accurately relative to the light-emitting devices 3. Particularly, an alignment accuracy on the order of not more than 10 µm can be achieved by performing alignment while microscopically observing the alignment marks 7, 17.

The present invention makes it a premise that the black matrix 13 is disposed between the light-emitting devices 3 in the condition of covering the peripheries of the light-emitting devices 3 where the alignment marks 7 on the side of the support substrate 1 and the alignment marks 17 on the side of the opposed substrate 11 are disposed in a predetermined condition, and, accordingly, the adhesion of the support substrate 1 and the opposed substrate 11 may be conducted so that the black matrix 13 is disposed on the outside surface on the opposite side of the support substrate 1.

In the above-described embodiment, the display unit and the method of manufacturing the same have been described in which the adhesive resin 21 is charged between the support substrate 1 and the opposed substrate 11 in the condition of sealing the light-emitting devices 3. However, the present invention in which alignment is conducted in the condition where the support substrate 1 and the opposed substrate 11 are adhered to each other and before the adhesive resin is cured can be applied also to the case where a support substrate provided with TFTs and a transparent opposed substrate are adhered through an adhesive resin only at a peripheral portion in the production of, for example, a liquid crystal display unit; in that case, also, easiness and enhanced accuracy of alignment can be contrived.

Besides, in the above-described embodiment, the display unit and the method of manufacturing the same have been described in which the support substrate provided with the devices and the opposed substrate provided with the black matrix are adhered to each other. However, the present invention in which alignment of the support substrate 1 and the opposed substrate 11 is conducted by using the alignment marks in the production of a display unit in which the adhesive resin 21 is charged between the support substrate 1 and the opposed substrate 11 in the condition of sealing the light-emitting devices 3 can be widely applied to the production of display units requiring highly accurate alignment for adhesion, such as, for example, alignment in the case of adhering a support substrate provided with devices and an opposed substrate provided with a color filter; in that case, also, easiness and enhanced accuracy of alignment can be contrived.

The present invention is not limited to the details of the above-described preferred embodiments. The scope of the invention is defined by the appended claims and all changes and modifications as fall within the equivalence of the scope of the claims are therefore to be embraced by the invention.

DRAWINGS

FIG. 1

1: support substrate

1a: display region

3: light-emitting device

7: alignment mark

13: black matrix

17: alignment mark

21: adhesive resin

FIG. 3

31: anti-reflection film

What is claimed is:

1. A display unit comprising:

a support substrate provided with light-emitting devices and inter-device wiring in a display region;

a transparent opposed substrate provided with a black matrix and disposed on the side of the surface forming the light-emitting device of said support substrate, said black matrix forming a pattern to cover at least said inter-device wiring; and a sealing adhesive resin charged and filling the space between said support substrate and said opposed substrate in the condition of sealing said light-emitting devices.

2. A display unit as set forth in claim 1, wherein said opposed substrate is provided in the condition where the surface forming the black matrix thereof is faced to said support substrate.

3. A display unit as set forth in claim 2, wherein an anti-reflection film is provided on the surface of said opposed substrate on the side opposite to the surface forming the black matrix.

4. A display unit as set forth in claim 1, wherein said black matrix is comprised of a laminate film having a predetermined reflected-light-attenuation structure or resin material film.

5. A display unit as set forth in claim 1, further comprising alignment marks used for aligning said light-emitting devices on said support substrate and said black matrix on said opposed substrate into a predetermined condition, said alignment marks being provided on the surface forming the light-emitting device of said support substrate and on said opposed substrate, and being located outside of the display region.

6. A display unit as set forth in claim 1, wherein said sealing adhesive resin acquires transparency when cured.

7. A method of manufacturing a display unit comprising the steps of:

providing light-emitting devices and inter-device wiring in a display region on a support substrate, providing a black matrix on a transparent opposed substrate, said black matrix forming a pattern to cover at least said inter-device wiring, and adhering said support substrate and said opposed substrate in the condition where said light-emitting devices are sealed with an adhesive resin and said adhesive resin is charged and fills the space between said support substrate and said opposed substrate.

8. A method of manufacturing a display unit as set forth in claim 7, wherein said support substrate and said opposed substrate are adhered in the condition where the surface forming the black matrix of said opposed substrate is faced to the surface forming the light-emitting device of said support substrate.

9. A method of manufacturing a display unit as set forth in claim 7, wherein said support substrate and said opposed substrate are aligned into a predetermined condition using alignment marks so that said black matrix is disposed to cover at least said inter-device wiring in the step of adhering said support substrate and said transparent opposed substrate.

10. A method of manufacturing a display unit as set forth in claim 9, wherein said alignment marks are provided on the surface forming the light-emitting device of said support substrate and on said opposed substrate, said alignment marks being located outside of the display region.

11. A method of manufacturing a display unit as set forth in claim 9, wherein said alignment of said support substrate and said opposed substrate is conducted in the condition where said support substrate and said opposed substrate are adhered to each other through said adhesive resin before said adhesive resin is cured, and thereafter said adhesive resin is cured.

12. A method of manufacturing a display unit comprising the steps of disposing an opposed substrate on the side of a display region provided on a support substrate, and adhering said support substrate and said opposed substrate through an adhesive resin, wherein alignment of said support substrate and said opposed substrate is conducted in the condition where said support substrate and said opposed substrate are adhered to each other through said adhesive resin and before said adhesive resin is cured, and thereafter said adhesive resin is cured.

13. A method of manufacturing a display unit as set forth in claim 12, wherein light-emitting devices are formed in said display region, and said adhesive resin is charged and fills the space between said support substrate and said opposed substrate in the condition of sealing said light-emitting devices.

14. A method of manufacturing a display unit comprising the steps of disposing an opposed substrate faced to a surface of a support substrate on which light-emitting devices are formed, and adhering said support substrate and said opposed substrate in the condition where said light-emitting devices are sealed with an adhesive resin and said adhesive resin is charged and fills the space between said support substrate and said opposed substrate, wherein alignment of said support substrate and said opposed substrate is conducted so that alignment marks provided on said support substrate and alignment marks provided on said opposed substrate are disposed in a predetermined condition in the step of adhering said support substrate and said opposed substrate, said alignment marks being located outside of the display region.

* * * * *